(12) United States Patent
Greimel-Längauer et al.

(10) Patent No.: US 11,067,436 B2
(45) Date of Patent: Jul. 20, 2021

(54) OPTICAL SENSOR ARRANGEMENT

(71) Applicant: ams AG, Premstaetten (AT)

(72) Inventors: Bernhard Greimel-Längauer, Gleisdorf (AT); Franz Lechner, Kumberg (AT); Josef Kriebernegg, Graz (AT); Herbert Lenhard, Graz (AT); Manuel Hoerbinger, Voitsberg (AT); Dan Jacobs, McKinney, TX (US)

(73) Assignee: AMS AG, Premstätte N (AT)

( * ) Notice: Subject to any disclaimer, the term of this patent is extended or adjusted under 35 U.S.C. 154(b) by 0 days.

(21) Appl. No.: 16/612,565

(22) PCT Filed: May 8, 2018

(86) PCT No.: PCT/EP2018/061868
§ 371 (c)(1),
(2) Date: Nov. 11, 2019

(87) PCT Pub. No.: WO2018/206575
PCT Pub. Date: Nov. 15, 2018

(65) Prior Publication Data
US 2020/0209055 A1 Jul. 2, 2020

Related U.S. Application Data

(60) Provisional application No. 62/504,818, filed on May 11, 2017.

(30) Foreign Application Priority Data

Jun. 8, 2017 (EP) ..................................... 17175055

(51) Int. Cl.
*G01J 1/42* (2006.01)
*G06F 1/16* (2006.01)
(Continued)

(52) U.S. Cl.
CPC ........... *G01J 1/4204* (2013.01); *G01J 1/0271* (2013.01); *G01S 7/4813* (2013.01);
(Continued)

(58) Field of Classification Search
CPC ......... G06F 1/1601–1605; G06F 3/041; G06F 3/0412; G06F 3/0416; G06F 3/04164;
(Continued)

(56) References Cited

U.S. PATENT DOCUMENTS 9,170,683 B2 * 10/2015 Drumm ................. G06F 3/0428
9,466,653 B2 10/2016 de Jong et al.
(Continued)

OTHER PUBLICATIONS

European Patent Office, International Search Report for PCT/EP2018/061868, dated Jun. 8, 2018.

*Primary Examiner* — Nathan Danielsen
(74) *Attorney, Agent, or Firm* — MH2 Technology Law Group, LLP

(57) ABSTRACT

The proposed concept relates to an optical sensor arrangement comprising an optical sensor with an integrated circuit arranged in or on a substrate. The substrate comprises at least a first surface area and a second surface area. At least one optically active sensor component is arranged on or in the substrate of the first surface area. The optically active sensor component is arranged for emitting and/or detecting light of a desired wavelength range. Optically inactive sensor circuitry is arranged on or in the substrate of the second surface area. A display panel comprises an active display area and a non-active display area, wherein the non-active display area comprises a material which is optically transparent in the desired wavelength range and wherein the non-active display area at least partly frames the active display layer. The optical sensor and the display panel are stacked such that, with respect to a main direction of display emission, the first surface area is arranged below the (Continued)

non-active display area and the second surface area is arranged below the active display area.

18 Claims, 4 Drawing Sheets

(51) Int. Cl.
    *G01S 7/481*     (2006.01)
    *H01L 27/32*     (2006.01)
    *G01J 1/02*     (2006.01)
    *H03K 17/94*     (2006.01)
    *G06F 3/042*     (2006.01)

(52) U.S. Cl.
CPC ........ *G06F 1/1601* (2013.01); *H01L 27/3269* (2013.01); *H03K 17/941* (2013.01); *G06F 3/042* (2013.01); *H01L 27/3227* (2013.01)

(58) Field of Classification Search
CPC ........... G06F 3/04166; G06F 3/041661; G06F 3/042; G06F 3/0421; G06F 3/0425–0428; G01J 1/0271; G01J 1/4204; G01J 3/505; G01J 3/506; G01S 7/481–4813; H01L 27/3225; H01L 27/3227; H01L 27/3232; H01L 27/3269; H03K 17/941; H03K 17/943

See application file for complete search history.

(56) References Cited

U.S. PATENT DOCUMENTS

| | | |
|---|---|---|
| 2009/0128529 A1 | 5/2009 | Izumi et al. |
| 2013/0075595 A1 | 3/2013 | Ruh |
| 2014/0061444 A1* | 3/2014 | Wang .................... G01S 7/4813 250/214.1 |
| 2014/0183342 A1 | 7/2014 | Shedletsky et al. |
| 2015/0378013 A1 | 12/2015 | Bikumandla et al. |
| 2017/0126868 A1* | 5/2017 | Evans, V ................ G01S 17/04 |
| 2017/0134545 A1* | 5/2017 | Lee ........................ G01J 1/0271 |
| 2017/0364763 A1* | 12/2017 | Jin ........................... G06F 21/32 |
| 2018/0211078 A1* | 7/2018 | Lillie ..................... G06F 3/044 |

\* cited by examiner

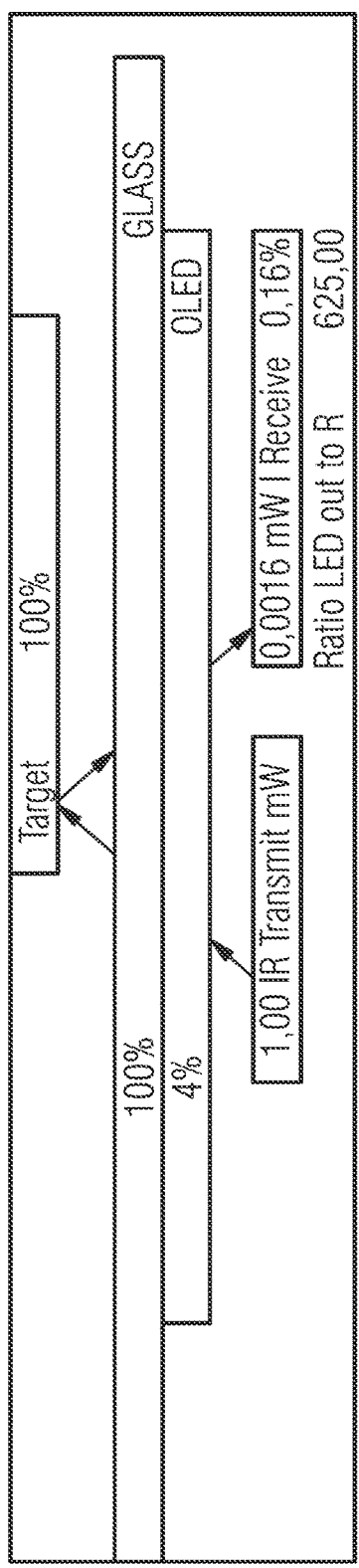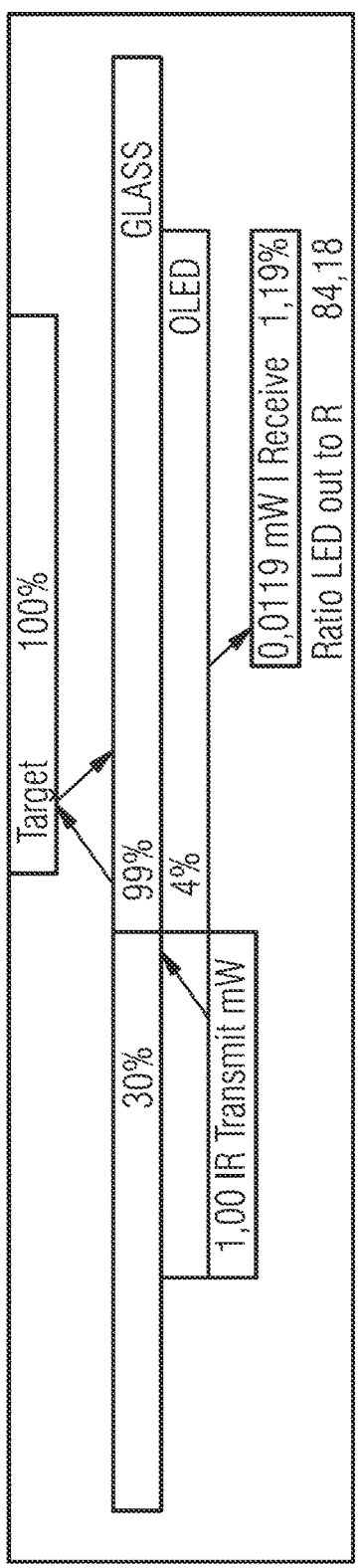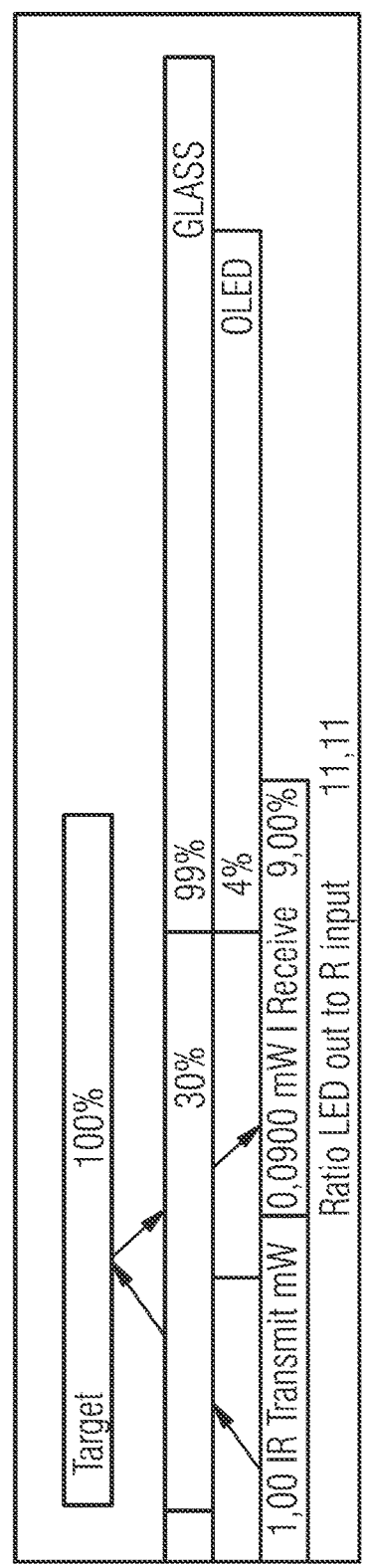

OPTICAL SENSOR ARRANGEMENT

This invention relates to an optical sensor arrangement.

BACKGROUND OF THE INVENTION

Electronic devices often include displays for presenting information to a user. Cellular telephones, portable computers such as tablets further comprise a growing number of sensors such as a proximity sensor, a time-of-flight sensor, an ambient light sensor, a color sensor or a gesture sensor. In typical electronic devices the display has an active display layer which is framed by a bezel layer which are arranged along a front face of the device.

Especially light sensors are located below the bezel layer, which typically is made from an optically transparent material. For example, light sensors in electronic devices are often emitting and/or detecting infrared (IR) radiation. For example, the bezel layer is adapted to the infrared as well and passes IR while visual light is mostly blocked. This way the bezel layer appears colored, e.g. black, and none of the electronic components placed below the bezel layer is visible. Thus, additional space is provided in common devices at the top, bottom, or side of the active display area to accommodate the light sensor. This can result in an undesirable increase in the size and weight of the device, and may appear bulky or result in overly large borders. These and other constraints limit the freedom for the design engineer to optimize the design other electronic device itself. For such design reasons often a frameless full display is desired.

Typically, however, the complete optical sensor is placed behind the bezel of the display, i.e. a location which is not used as an active display area. To fulfil the optical requirements for this implementation, typical package sizes for a proximity or ambient light sensing application are in the range of 2 mm times 4 mm. This means with all the manufacturing tolerances, the required bezel size typically resides in the range of 4 to 5 mm. For a frameless display design, however, the prior art of device packages require bezel sizes in the range of millimeters, respectively. The chip and package design proposed so far show high complexity and are expensive.

Attempts have been made to overcome the design limitations For example, the display was directly modified to improve its transmissivity. Other approaches suggested to integrate the optical sensor as part of the display. The drawback of these solutions, however, is that this may work for ambient light sensing (ALS) applications but proximity implementations will become comparably difficult. The transmitting proximity pulses are disturbing the display, e.g. an OLED display, even with light in the IR range.

SUMMARY OF THE INVENTION

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the optical sensor arrangement as defined in the accompanying claims.

In the following, an improved concept for an optical sensor arrangement is presented. It is suggested to place the optically active sensor component, e.g. a light detector and/or light transmitter, of an optical sensor closely outside of an edge of the active layer of a display. This approach may be advantageous for several types of optical sensors including proximity sensors, time-of-flight sensors, ambient light sensors, color sensors and/or a gesture sensors. In fact, the improved concept allows for optical sensor arrangements for full format display applications, for example for mobile phones, with a bezel size less than 1 mm. Current implementations with existing devices require bezels with a width of about 3 to 4 mm. According to an aspect of the improved concept, the optical part of the sensor, i.e. detector and transmitter or detector or transmitter, is placed at the edge of the bezel and looking through the bezel, and the rest of the optical sensor is placed behind the active display. This allows for much smaller apertures in sensor packaging. However, even existing sensor package technologies can be adapted to be used with the improved concept as will be discussed in further detail below.

In at least one embodiment an optical sensor arrangement comprises a stack having an optical sensor and a display panel. The optical sensor comprises at least one optically active sensor component and optically inactive sensor circuitry.

The optical sensor comprises an integrated circuit which is arranged in or on a substrate. The substrate comprises at least a first surface area and a second surface area. For example, a main surface of the substrate is divided into the first and the second surface area. The integrated circuit may at least partially overlap with the first and second surface areas. For example, optically inactive sensor circuitry is located in the integrated circuit which is mounted on the substrate of the second surface area, for example. Light transmitters such as laser diodes may not be integrated into the integrated circuit. Such components may be arranged in or one the substrate of the first surface area. Furthermore, the integrated circuit is electrically connected to the substrate.

The optically active sensor component is arranged on or in the substrate. In fact, the optically active sensor component is located on or near the first surface area. For example, the optically active sensor component may be placed on the first surface area. In case the optically active sensor component is arranged in the integrated circuit the first surface area overlaps with the optically sensitive sensor component, e.g. overlapping with a light sensitive or a light emitting surface of the component. The optically active sensor component is arranged for emitting and/or detecting light of a desired wavelength range. For example, the optically active sensor component may be sensitive to or emitting infrared, visual or UV radiation. The desired wavelength range may be a single wavelength with characteristic linewidth or an interval of wavelengths such as a bandwidth of a filter.

The optically inactive sensor circuitry is arranged on or in the substrate. In fact, the optically inactive sensor circuitry is located on or near the second surface area. For example, the optically inactive sensor circuitry may be arranged on the second surface area. In case the optically active sensor circuitry is arranged in the integrated circuit the second surface area overlaps with the optically sensitive sensor circuitry. The optically inactive sensor circuitry is not optically active, this is to say that the circuitry is not arranged for either emitting light or detecting light or electromagnetic radiation.

The display panel comprises an active display area and a non-active display area. The non-active display area comprises a material which is optically transparent in the desired wavelength range and at least partly frames the active display area. For example, different types of display panels may be used with the proposed optical sensor arrangement such as a flat-panel display including liquid crystal displays (LCDs), liquid crystal displays with light-emitting diode (LED) backlighting, plasma panels, electroluminescent panels or displays based on organic light-emitting diodes (OLEDs). Typical displays may have a plurality of individual picture elements ("pixels"). The term "active display area" refers to the fact that this area of the display panel is arranged for emitting light of one or more wavelengths, e.g. by means of active pixels or backlighting etc., which may be guided or reflected back towards the light sensor arrangement. Light is emitted from the active display area into an emission cone, for example. The emission can be characterized by means of a main direction of display emission. Said direction may be defined by a surface normal of the display and typically is perpendicular with respect to the active display area. The areas of the display panel can also be defined using the main direction of display emission. When viewed from the main direction of display emission the non-active display area at least partly frames the active display area. However, both areas do not necessarily have to lie in the same plane. For example, the non-active display area could be defined by a cover such as a glass or plastic cover plate, by a non-active layer of the display, such as a dielectric or substrate layer, a bezel, such as a bezel layer attached or coated onto the rest of the display panel.

Typically, an active display layer, comprising the active display area, is mounted in an electronic device housing and framed by a bezel layer. For example, the bezel layer relates to a display bezel that surrounds the display. For example, the bezel layer is arranged at the top, bottom, or side of the active display area. The bezel layer may be integrated with the display layer to form the display or be attached to or covering the active display layer, e.g. as a coating or painting. Typically, the bezel layer is made from an optically transparent material. For example, the optical sensor may emit and/or detect infrared (IR) radiation. Then the bezel layer is adapted to the infrared as well and passes IR while visual light is mostly blocked. This way the bezel layer appears black and none of the electronic components placed below the layer is visible. However, the bezel layer may have any other color as well. The term "transparent" indicates that at least some radiation in the desired wavelength range is able to traverse trough the bezel layer, i.e. opacity does not necessarily have be 100% but is at least greater than 0%.

The optical sensor and the display panel are stacked such that, with respect to the main direction of display emission, the first surface is arranged below the non-active display area and the second surface area is arranged below the active display area. In other words in a top view (viewed along a direction defined by a surface normal parallel to main direction of display emission) the optically inactive sensor circuitry is arranged below the active display area and the optically active sensor components are arranged below the non-active display area. The term "below" is used to describe the location of the optically active sensor component and an optically inactive sensor circuitry in the optical stack made from the optical sensor and the display panel. However, it may not be excluded that some part of these components may to a certain degree extend to the first or second surface area, respectively. However, the optically active sensor component is arranged below the non-active display area in a way that emission and/or detection via the bezel layer is possible. For example, at least light sensitive areas and/or emission sites of the optically active sensor component are arranged below the non-active display area such that emission or detection of light is possible.

Light sensing applications may benefit from the proposed arrangement. For example, the optically active sensor component can be placed at an edge of the display outside of the active display area. The non-active display area, e.g. a bezel layer, can be kept small resulting in more freedom for designing an electronic device incorporating the optical sensor arrangement. A further advantage is that the non-active display area such as the bezel may have improved IR transmissivity compared to the active display area. This way the display pixels may not disturbed by an IR radiation of the optical sensor. With respect to applications such as proximity sensitivity, there may be a gain of a factor of 8 in comparison with other application where both the transmitter and the detector are placed behind the active display area. For example, transmissivity of an OLED display layer is in the range of 3 to 6% for infrared compared to 30% for common no-hole proximity solutions behind a bezel.

In at least one embodiment the optically active sensor component comprises said least one light detector and/or at least one light transmitter. The light detector may be a single light detector or an array of several light detectors. For example, several light detectors can also be spatially separated as a main and reference detector such as in time of flight applications. Similarly, the light transmitter may be a single emitter or an arrangement of several light emitters.

In at least one embodiment the light detector comprises a single pixel photodiode, a multi-pixel photodiode such as an array of photodiodes or a multi-pixel photodiode with one or more filters attached. The filters may be arranged in an array of the same type of filters or in a matrix of different filters, such as a Bayer matrix.

In at least one embodiment the light transmitter comprises a laser diode, surface emitting laser, a vertical cavity surface emitting laser, an infrared light emitting photodiode and/or to visual light emitting photodiode. Typically, the light transmitter is connected to the integrated circuit and may not be integrated in the integrated circuit.

In at least one embodiment the optically inactive sensor circuitry comprises at least one of logic components, analog components and/or electrical connections. For example, appropriate control logic, analog-to-digital converters, microprocessors, Light-to-Digital (LTD), Light-to-Voltage (LTV) and Light-to-Frequency (LTF) components, driver units and interfaces may be integrated into the same integrated circuit or attached thereto. Finally, electrical connections such as wire bonds or through-silicon-vias may be arranged at least on the second surface.

In at least one embodiment the optical sensor comprises at least one further light detector. For example, two detectors can serve as a main and reference light detector for time of flight applications. Another example relates to Iris scan security applications, for example.

In at least one embodiment the optical sensor comprises at least one further light transmitter. For example, proximity or time of flight applications can be further supported by having more than a single light transmitter.

At least one embodiment, the optical sensor is a proximity sensor, a time of flight sensor, and ambient light sensor, a color sensor and/or a gesture sensor.

In at least one embodiment the proximity sensor and/or the time of flight sensor comprises at least one light detector and at least one light transmitter.

In at least one embodiment both the light detector and the light transmitter are arranged on or in the substrate of the first surface area. In this case the optically active sensor components are both located below the non-active display area, such as the bezel layer. Neither light emission nor detection traverses through the active display area but only the non-active display area.

Alternatively, the light detector is arranged on or in the substrate of the first surface area and the light transmitter is arranged on or in the substrate of the second surface area. In this case only one optically active sensor component is arranged below the non-active display area, such as the bezel layer, and emits through this area. Detection, however, may occur after light is reflected by an external object towards the active display area and penetrates through the area to be detected.

In at least one embodiment the ambient light sensor and/or the color sensor comprises the at least one light detector. The at least one light detector is arranged on or in the substrate of the first surface area. In this case light detector is arranged below the non-active display area, e.g. the bezel layer.

In at least one embodiment the optical sensor is encapsulated by a molded sensor package. The sensor package is arranged below the display such that an air gap remains between the sensor package and the display panel. The air gap may have different values for part of the same sensor package arranged below the non-active display area and for another part of the sensor package arranged below the active display area, for example.

In at least one embodiment the at least one further light detector and/or the at least one further light transmitter are arranged in the same sensor package or, alternatively, are arranged in a separate sensor package.

In at least one embodiment the light barrier is arranged on the integrated circuit and/or on the substrate to optically isolate the light detector and the light transmitter.

In at least one embodiment the light detector and the light transmitter are arranged at different heights with respect to the substrate.

In at least one embodiment, both the sensor area for the light transmitter and the light detector can be placed at an edge of the display panel, i.e. below the non-active display area, and the sensor circuitry with logic included as well as the analog blocks and pin connection can be placed below the active display area. Since both transmitter and receiver are looking through the non-active display area, such as the u-bezel, the sensitivity will be in the same range as of current implementations.

In at least one embodiment a solution for air gap reduction is realized by using a package design with a higher package mold thickness. Additionally or instead of that, the airgap space in the non-active display area can be used to design an optical stack, for example using a lens design.

In at least one embodiment an IR light transmitter can be used as further light transmitter either in a different or the same sensor package. The further light transmitter can be placed below the non-active display area at an edge of the display or another IR light transmitter can be used which is already present in the electronic device such as a transmit diode for IRIS scanning.

In at least one embodiment the integrated circuit has a thicker die in the area defined by the first surface area than in the area defined by the second surface area. This way the light transmitter is arranged on the thicker die area and transmits light at a higher point than the light detector which allows for reducing crosstalk.

In at least one embodiment the light transmitter is a VCSEL or a similar device, which stands at a higher point than the light detector giving more directed light to better overcome crosstalk.

In at least one embodiment a lid can be used for light shielding.

In at least one embodiment the optical sensor comprises a single transmitter or multiple transmitters for proximity, or a combination with an internal transmitter and an external from Iris scan, for example.

In at least one embodiment the integrated circuit comprises the at least one optically active sensor component and the optically inactive sensor circuitry. In other words the at least one optically active sensor component and the optically inactive sensor circuitry can be integrated or connected to the same integrated circuit. The at least one optically active sensor component and the optically inactive sensor circuitry can be considered components of the optical sensor.

In at least one embodiment the integrated circuit has a part defined by the first surface area and a part defined by the second surface area. In other words the integrated circuit (or the optical sensor) can be arranged on the substrate such that a part having the at least one optically active sensor component is located on the first surface area of the substrate. And a part having the optically inactive sensor circuitry can be located on the second surface area of the substrate.

In the following, the principle presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

BRIEF DESCRIPTION OF THE DRAWINGS

FIG. 7 shows an exemplary comparison for embodiments of an optical sensor arrangement.

DETAILED DESCRIPTION

Figure 1:
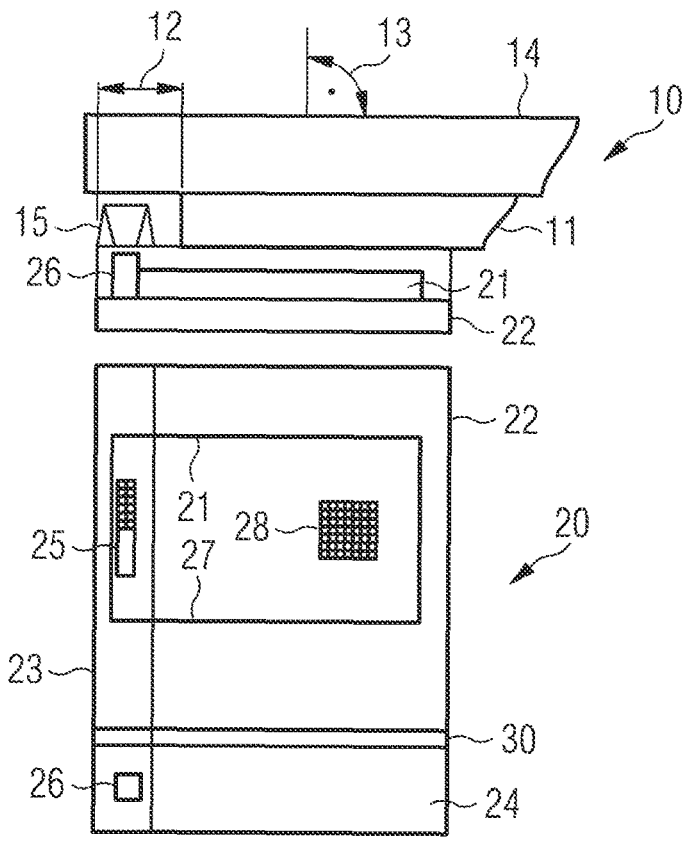
FIG. 1 shows an exemplary embodiment of an optical sensor arrangement.

FIG. 1 shows an exemplary embodiment of an optical sensor arrangement. The drawing shows the optical sensor arrangement from different perspectives in a side and top view.

The optical sensor arrangement comprises a substrate 22 and an integrated circuit 21 arranged on the substrate. A light transmitter 26 is also arranged on the substrate. The light transmitter and the integrated circuit are separated by an optical light barrier 30.

In this embodiment, the integrated circuit 21 comprises a first light detector 25 and a second light detector 28. The first light detector is arranged for proximity applications. For example, this light detector comprises first and second sensor areas designed as main and reference detectors. The first light detector could be implemented as a single photodiode, e.g. an infrared sensitive photodiode, or as an array of several such photodiodes. The second light detector could be a supplemental detector such as an ambient light or color sensor. The second light detector could also be implemented as a single photodiode, e.g. such as an infrared sensitive photodiode, or as an array of several such photodiodes.

The light transmitter 26 comprises a vertical cavity surface emitting laser, or VCSEL for short. Alternatively, the light transmitter comprises a vertical external cavity surface emitting laser, VECSEL for short. Both laser types are configured to emit light, such as infrared or visual light. For example, emission can be pulsed or in a modulated continuous wave, such as a sinusoid or square wave. Typically, the light transmitter is connected to the integrated circuit and the integrated circuit comprises a driver circuit. However, in alternative embodiments the integrated circuit may also comprise the light transmitter itself if this component can be integrated, by means of a CMOS process, for example.

The light barrier 30 is arranged on the substrate, e.g. along the whole profile of the substrate. The light barrier is arranged to block light, e.g. the emission from the light transmitter, from reaching the detectors. As such the light barrier is a means to reduce optical crosstalk in the optical sensor arrangement. For example, the light barrier comprises a light blocking material, such as an optically opaque mold material. Furthermore, the light barrier has an optical design that supports blocking of light, e.g. has a certain height (not shown) that is sufficient to block direct optical paths connecting the detectors and the transmitter but leaves a certain airgap to a display and/or display glass.

The arrangement of the optical sensor below a display panel 10 and display cover 14 is shown in a side view (top drawing) and a top view (drawing below). In fact, the side view shows parts of the display panel and display cover that cover a main surface of the substrate 22. The display panel 10 comprises an active display area 11. The active display area is part of a flat-panel display, for example, and has a plurality of individual picture elements ("pixels"). The active display area is arranged for emitting light of one or more wavelengths, e.g. by means of active pixels or backlighting. The light is emitted by the active display area along a main direction 13 of display emission. Said direction may be defined by a surface normal of the display and typically is perpendicular with respect to the active display area. In this sense the optical sensor is arranged below the display panel, i.e. below the active display area and the display cover.

The display cover 14 comprises a non-active display area 12 which does not emit light. In this embodiment the non-active display area is implemented as a bezel layer, e.g. as a coating or painting. As can be seen from view 4, a first surface area 23 of the integrated circuit is arranged below the bezel layer 12 and a second surface area 24 of the integrated circuit is arranged below the active display area 11. The first light detector 25 is arranged on the first surface, i.e. below the bezel layer. The light transmitter 26 is arranged below the bezel layer 12 as well but mounted on or in the substrate, i.e. not arranged on the integrated circuit. In other embodiments, however, the light transmitter could be an integral part of the integrated circuit. In conclusion, both the light transmitter and detector are optically active sensor components and are arranged below the bezel layer. The second light detector 28 is also an optically active sensor component but is arranged on the second surface, i.e. below the active display area rather than the bezel layer.

The bezel layer 12 is made from an optically transparent material. For example, as light sensors in electronic devices are often emitting and/or detecting infrared (IR) light, the bezel layer is adapted to the infrared light as well, i.e. passes IR while visual light is mostly blocked. This way the bezel layer appears black and none of the electronic components placed below the layer is visible. The bezel layer and optically active sensor components could also be arranged for visual or UV light or have any color other than black.

The optical sensor arrangement further comprises optically inactive sensor circuitry 27 (not shown) which can be arranged or located in the part of the integrated circuit defined by the second surface. This may not be a strict requirement and some of these components may also be arranged in the part of the integrated circuit defined by the first surface. However, at least some of the optically active sensor components are arranged in or on the first surface. The optically inactive sensor circuitry includes logic components, analog components and/or electrical connections. For example, appropriate control logic, analog-to-digital converters, microprocessors, Light-to-Digital (LTD), Light-to-Voltage (LTV) and Light-to-Frequency (LTF) components, driver units and interfaces may be integrated into the same integrated circuit or attached thereto. Finally, electrical connections such as wire bonds or through-silicon-vias may be arranged on the second surface.

The second surface 24 provides a convenient space for optically inactive sensor circuitry 27. If placed in this part of the optical sensor the circuitry does not contribute to the first surface which, in turn, can be kept rather small. As one consequence the non-active display area, e.g. the bezel layer 12 may also be rather small, e.g. 500 to 1000 µm in width. This supports the design of full frame displays for electronic devices, such as displays, mobile phones, tablets, portable computers etc.

Figure 2:
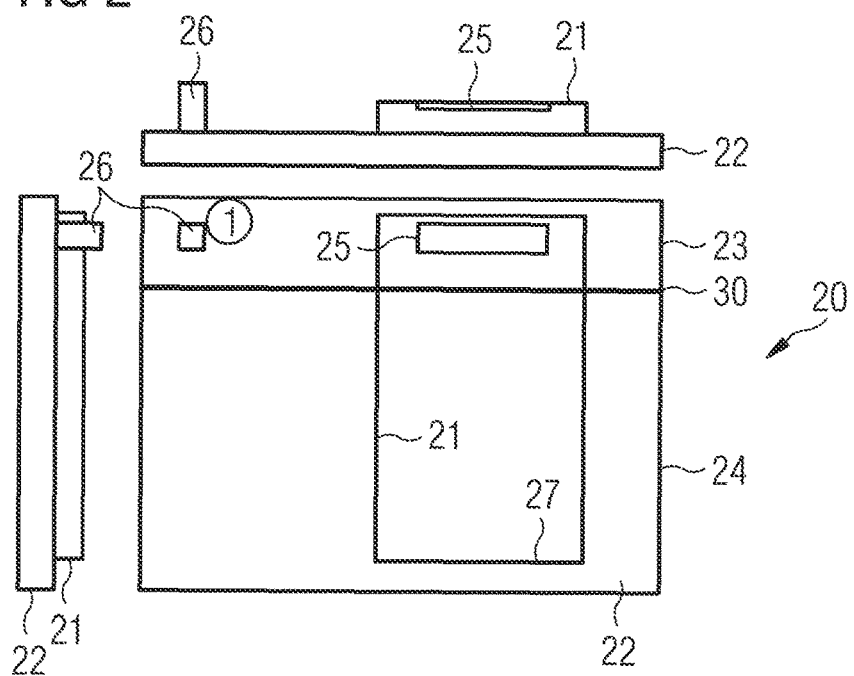
FIG. 2 shows another exemplary embodiment of an optical sensor arrangement.
Figure 3:
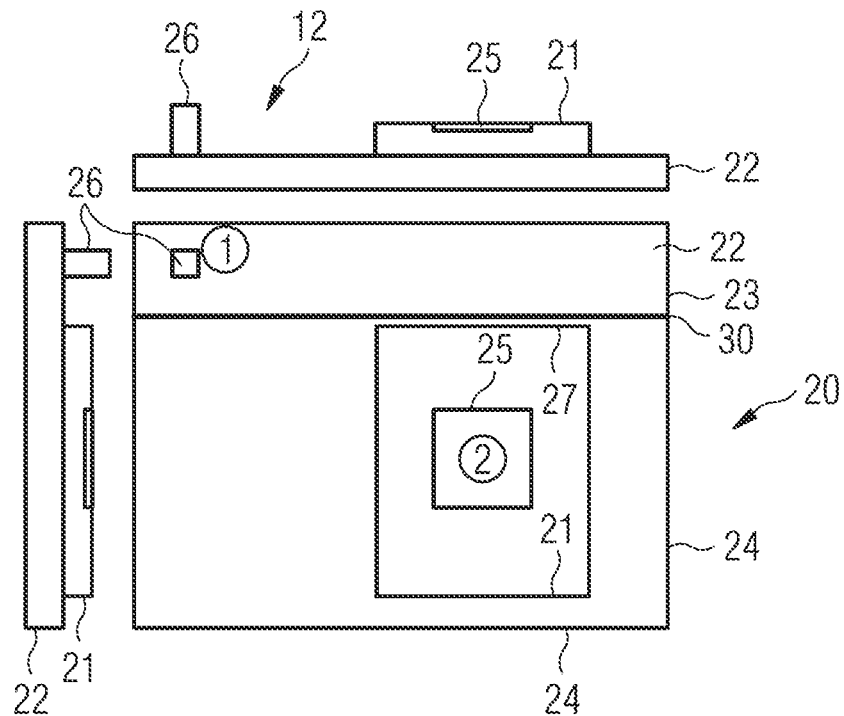
FIG. 3 shows another exemplary embodiment of an optical sensor arrangement.
Figure 4:
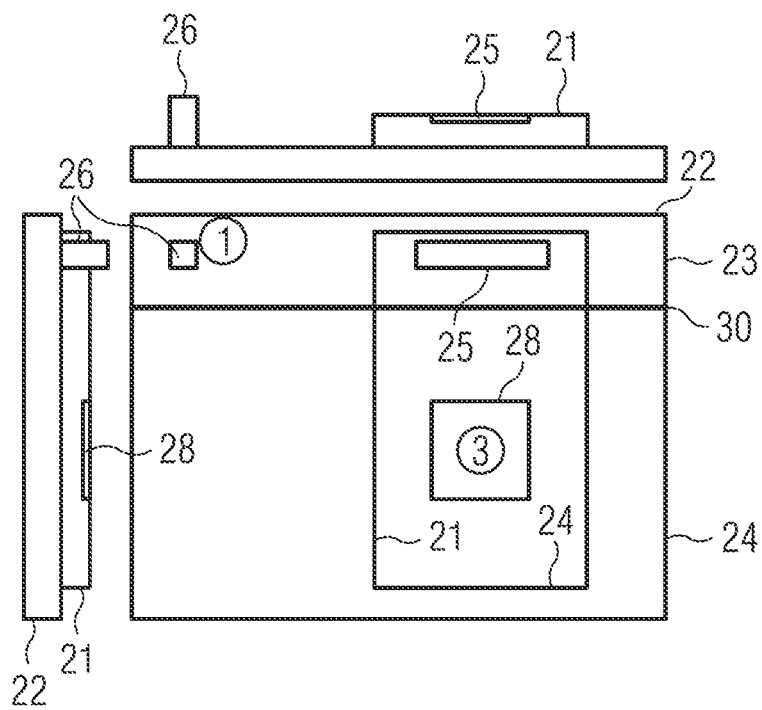
FIG. 4 shows another exemplary embodiment of an optical sensor arrangement.

FIGS. 2 to 4 show further exemplary embodiments of optical sensor arrangements. These embodiments only differ from the one shown in FIG. 1 by the specific placement of optically active sensor components. The active display area 11 and display cover 14 are not shown for reasons of easier representation. The drawings each show a top view and two side views of the given optical sensor arrangements.

The embodiment of FIG. 2 is similar to the one of FIG. 1. Both the optical transmitter and optical detector are arranged along a long side of the substrate within the optical sensor integrated circuit perpendicular to this direction. The light barrier 30 spans along the long side of the optical sensor as well and divides the first surface from the second surface. In FIG. 3 only the light transmitter is arranged on the first surface. The integrated circuit having the light detector is arranged below the active display area on the second surface. Finally, the embodiment of FIG. 4 is a combination of the embodiments of FIGS. 2 and 3. The light transmitter is arranged on the substrate together with a light detector. The light barrier 30 spans along the long side of the optical sensor and over the integrated circuit and divides the first surface from the second surface.

Figure 5:
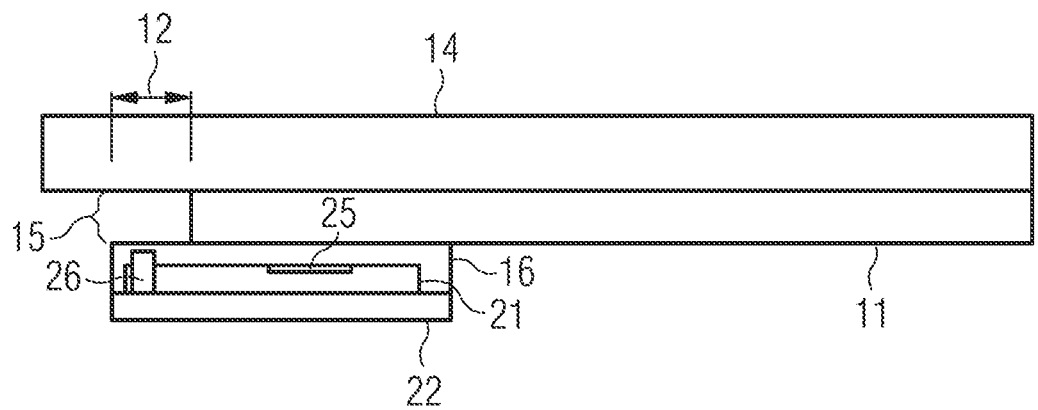
FIG. 5 shows another exemplary embodiment of an optical sensor arrangement.
Figure 6:
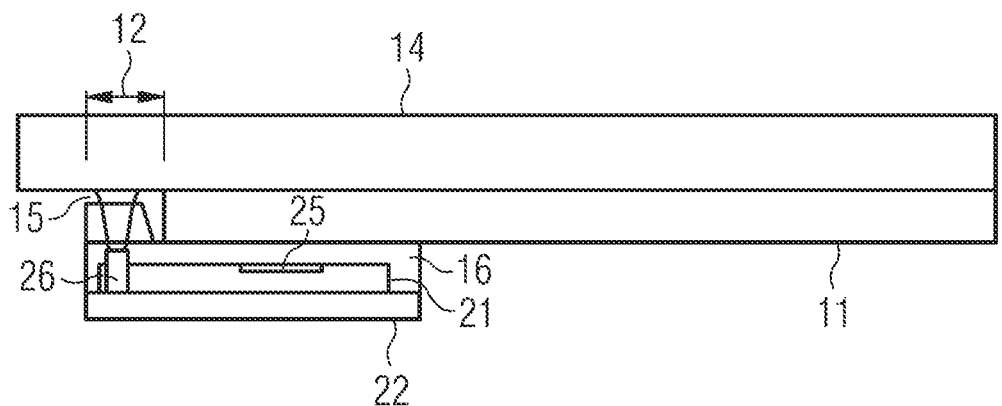
FIG. 6 shows another exemplary embodiment of an optical sensor arrangement.

FIGS. 5 and 6 show further embodiments of an optical sensor arrangements. Depicted are side views of the active display area, non-active display area 12, e.g. the bezel layer, and the display cover 14. The embodiment shown in FIG. 5 has a larger airgap 15 between the display panel 10 and an sensor package 16 as the one shown in FIG. 6. The airgap 15 is implemented by placing the light transmitter at different heights, for example. This way optical crosstalk can be reduced by means of package design.

FIG. 7 shows an exemplary comparison for exemplary embodiments of optical sensor arrangements. The drawing depicts three different embodiments. All embodiments comprise an active display area made of OLEDs. This area is assumed to have a transmissivity of 4%. The active display area is covered by a glass cover which is assumed to have a transmissivity of 100%. Furthermore, an object or target is placed at a distance with respect to the optical sensor arrangements. The object is assumed to have 100% reflectivity.

Box A shows an optical sensor arrangement for proximity applications where both the transmitter and the detector are arranged behind the display panel. IR light of 1 mW is emitted by a light transmitter and traverses through the active display area and the glass cover. After being reflected at the object said light traverses through the active display area and the glass cover for a second time. All in all 0.0016 mW of the emitted light power eventually is detected by the light detector, i.e. only 0.16% of the emitted light. This corresponds to a ratio of output vs. input of 625.

Box B shows an optical sensor arrangement for proximity applications where the transmitter is arranged behind the bezel layer and the detector is arranged behind the active display area. IR light of 1 mW is emitted by a light transmitter and traverses through the bezel layer (and the glass cover if present) and is attenuated by 70%. After being reflected at the object said light traverses through the active display area and the glass cover. All in all 0.0119 mW of the emitted light power eventually is detected by the light detector, i.e. 1.19% of the emitted light. This corresponds to a ratio of output vs. input of 84.18.

Box C shows an optical sensor arrangement for proximity applications where the transmitter is arranged behind the active display area and the detector is arranged behind the bezel layer. IR light of 1 mW is emitted by a light transmitter and traverses through the bezel layer. After being reflected at the object said light traverses again through the bezel. Each time the light is attenuated by 70%. All in all 0.0900 mW of the emitted light power eventually is detected by the light detector, i.e. 9.00% of the emitted light. This corresponds to a ratio of output vs. input of 11.11. These estimates highlight the increase in detection efficiency if one or all optically active sensor components are arranged below the bezel layer.

The invention claimed is:

1. An optical sensor arrangement, comprising:
   an optical sensor comprising an integrated circuit arranged in or on a substrate, wherein the substrate comprises at least a first surface area and a second surface area,
   at least one optically active sensor component arranged on or in the substrate of the first surface area, wherein the optically active sensor component is arranged for emitting and/or detecting light of a desired wavelength range,
   optically inactive sensor circuitry arranged on or in the substrate of the second surface area,
   a display panel comprising an active display area and a non-active display area, wherein the non-active display area comprises a material which is optically transparent in the desired wavelength range and at least partly frames the active display area; and wherein
   the optical sensor and the display panel are stacked such that, with respect to a main direction of display emission defined by a surface normal of the display panel and perpendicular to the active display area and such that, in a top view along a direction defined by the surface normal, the optically inactive sensor circuitry component is arranged below the active display area and the optically active sensor component is arranged below the non-active display area.

2. An optical sensor arrangement according to claim 1, wherein the optically active sensor component comprises at least one light detector and/or at least one light transmitter.

3. An optical sensor arrangement according to claim 2, wherein the light detector comprises a single pixel photodiode, a multi-pixel photodiode or a multi-pixel photodiode with a filter array attached.

4. An optical sensor arrangement according to claim 2, wherein the light transmitter comprises a laser diode, a surface emitting laser, a vertical cavity surface emitting laser, an infrared light emitting photodiode and/or visual light emitting photodiode.

5. An optical sensor arrangement according to claim 2, wherein the optical sensor comprises at least one further light detector.

6. An optical sensor arrangement according to claim 2, wherein the optical sensor comprises at least one further light transmitter.

7. An optical sensor arrangement according to claim 2, wherein a light barrier is arranged on the integrated circuit and/or on the substrate to optically isolate the light detector and the light transmitter.

8. An optical sensor arrangement according to claim 2, wherein the light detector and the light transmitter are arranged at different heights with respect to the substrate.

9. An optical sensor arrangement according to claim 1, wherein the optically inactive sensor circuitry comprises at least one of logic components, analog components, and/or electrical connections.

10. An optical sensor arrangement according to claim 1, wherein the optical sensor is a proximity sensor, a time-of-flight sensor, an ambient light sensor, a color sensor and/or a gesture sensor.

11. An optical sensor arrangement according to claim 10, wherein the proximity sensor and/or the time-of-flight sensor comprises at least one light detector and at least one light transmitter.

12. An optical sensor arrangement according to claim 10, wherein
   both the light detector and the light transmitter are arranged on or in the substrate of the first surface area or
   the light detector is arranged on or in the substrate of the first surface area and the light transmitter is arranged on or in the substrate of the second surface area.

13. An optical arrangement according to claim 10, wherein
   the ambient light sensor and/or the color sensor comprise the at least one light detector, and
   the at least one light detector is arranged on or in the substrate of the first surface area.

14. An optical sensor arrangement according to claim 1, wherein
   the optical sensor is encapsulated by a molded sensor package,
   the sensor package is arranged below the display panel such that an air gap remains between the sensor package and the display panel, and
   the air gap has different values for a part of the sensor package arranged below the non-active display area and for another part of the sensor package arranged below the active display area.

15. An optical sensor arrangement according to claim 14, wherein the optical sensor comprises at least one further light detector and, at least one further light transmitter, or both the at least one further light detector and the at least one further light transmitter are arranged in the same sensor package or are arranged in a separate sensor package.

16. An optical sensor arrangement according to claim 1, wherein the integrated circuit comprises the at least one optically active sensor component and the optically inactive sensor circuitry.

17. An optical sensor arrangement according to claim 16, wherein the integrated circuit has a part defined by the first surface area and a part defined by the second surface area.

18. An optical sensor arrangement, comprising:
- an optical sensor comprising an integrated circuit arranged in or on a substrate, wherein the substrate comprises a main surface divided into a first surface area and a second surface area,
- at least one optically active sensor component arranged on or in the substrate of the first surface area, wherein the optically active sensor component is arranged for emitting and/or detecting light of a desired wavelength range,
- optically inactive sensor circuitry arranged on or in the substrate of the second surface area,
- a display panel comprising an active display area and a non-active display area, wherein the non-active display area comprises a material which is optically transparent in the desired wavelength range and at least partly frames the active display area; and wherein
- the optical sensor and the display panel are stacked such that, with respect to a main direction of display emission defined by a surface normal of the display panel and perpendicular to the active display area and such that, in a top view along a direction defined by the surface normal, the optically inactive sensor circuitry component is arranged below the active display area and the optically active sensor component is arranged below the non-active display area.

* * * * *